INVENTOR.
PETER T. ROBINSON
BY
Mueller, Aichele & Rauner
ATT'YS.

(Actual Size)

INVENTOR.
PETER T. ROBINSON
BY
Mueller, Aichele & Rauner
ATT'YS.

United States Patent Office 3,394,037
Patented July 23, 1968

3,394,037
METHOD OF MAKING A SEMICONDUCTOR DEVICE BY MASKING AND DIFFUSION

Peter T. Robinson, Scottsdale, Ariz., assignor to Motorola, Inc., Franklin Park, Ill., a corporation of Illinois
Filed May 28, 1965, Ser. No. 459,574
8 Claims. (Cl. 148—187)

ABSTRACT OF THE DISCLOSURE

A transistor in which both junctions extend to a single passivated surface is prepared by a sequence of steps involving a single impurity diffusion operation to form both the emitter junction and the collector junction at the same time. Oxide masking and passivation of the upper surface of a wafer is patterned to include a moat surrounding the emitter window. A conductivity-type determining impurity is then predeposited on the semiconductor surface exposed by the emitter window, on the exposed surface of the moat, and also on the entire back surface of the wafer. The time and temperature of a subsequent diffusion baking step are controlled in order simultaneously to move a diffused emitter region inward from the upper surface of the wafer, and a collector region inward from the back surface of the wafer. At the same time, a diffused region moves inward from the moat surfaces to merge with the diffused collector region diffused from the back surface of the wafer, to complete the formation of an emitter junction and collector junction terminating at the upper surface of the wafer, in a single diffusion operation.

Figure 1A:
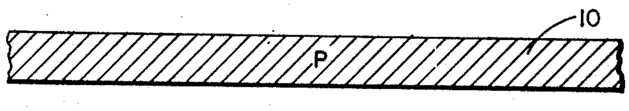

The invention relates to transistors especially of the power type, in which the junction is completely covered and passivated by insulating material. The invention also includes a method of making such transistors by a single diffusion step.

Transistors made by diffusing impurity material into both sides of a semiconductor wafer in a single diffusion step are sometimes called single-diffused transistors. When making a single-diffused transistor, past practice has been to predeposit an impurity material, for example, N-type, on both sides of a wafer of opposite conductivity, for example, P-type. Then by selective masking and etching techniques a portion of the N-type impurity is removed from one side of the wafer, called the front surface. The wafer is then exposed to a baking operation, called a drive-in diffusion, which forms the emitter region from that portion of the impurity material left on the front surface, and the collector region from the impurity material predeposited on the back surface of the wafer. The base region is that portion of the wafer which is between the emitter region and collector region.

When the processing steps are completed on the wafer, the individual transistor elements or dice can be separated out of the wafer by a convenient means for example by etching, or scribing and breaking techniques.

A disadvantage inherent in the prior art process outlined briefly above, and in the units fabricated by such a process, is that the junctions do not terminate in a single surface. It is well known that in order to reduce leakage and resulting degradation of the electrical characteristics of the completed transistor, the junctions of the transistor may be passivated by applying a suitable insulating coating, for example, an oxide formed at high temperature may be used. To provide such a coating on junctions terminating at more than one surface of the semiconductor would be extremely difficult and the cost would be very high if not prohibitive.

It is therefore an object of the present invention to provide an improved process and method for the fabrication of diffused junction semiconductor units, wherein the junctions all terminate in a single surface of the semiconductor unit.

Another object of the invention is to provide a semiconductor unit fabricated by a single diffusion wherein the junctions are passivated.

A further object of the invention is to provide an improved method for producing a passivated single-diffused transistor which provides a unit of high quality and which can be produced at low cost.

A feature of this invention is the provision of a single-diffused transistor wherein impurity layers are diffused in opposite sides of a wafer to form emitter and collector regions and wherein an annular moat is formed about the emitter prior to diffusion so the diffusion from the moat extends through the wafer to the collector junction to bring the collector junction to the same side of the wafer as the emitter junction.

Another feature of the invention is the provision of a single-diffused transistor as set forth in the preceding paragraph wherein an insulating layer is provided on one side of the wafer through which the diffusion is controlled, and this layer remains on the surface to passivate the emitter and collector junctions.

A further feature of the invention is the provision of a single-diffused transistor including a substrate on which an epitaxial layer is formed, with a moat provided in the epitaxial layer and then an emitter diffused in the layer and a portion diffused at the moat to engage the substrate to bring the collector junction to the surface of the epitaxial layer.

Figures 3A, 3B, 3C, 3D, 3E:
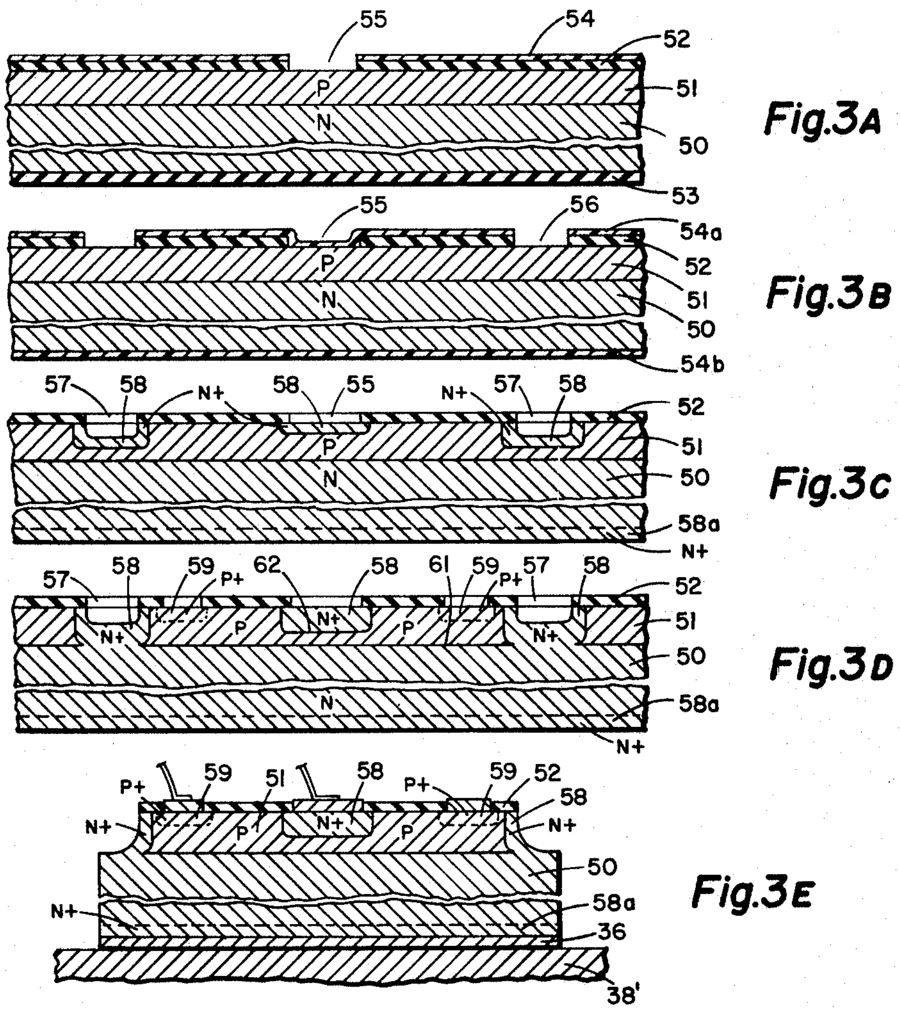
Figure 4:
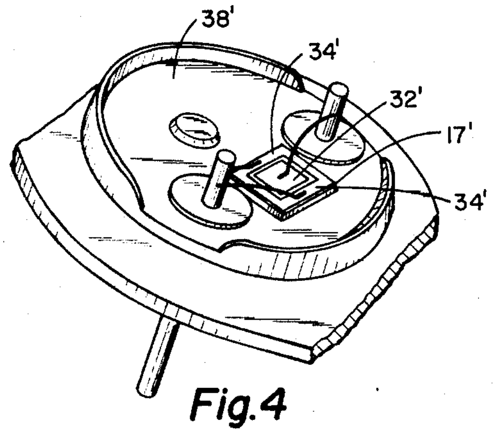
Figure 5:
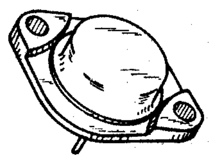

In the drawings:

FIG. 1 is a series of sectional views illustrating the successive steps in carrying out the method of the invention, in accordance with a preferred embodiment, FIG. 2 shows an alternative sequence of performing the initial etching steps of the method, FIG. 3 illustrates the steps of the method of the invention using epitaxial techniques, FIG. 4 is a partial cutaway perspective view of a transistor manufactured according to the invention, and FIG. 5 is an actual size embodiment of one type of transistor manufactured according to the invention.

In the practice of the present invention, a mask composed of silicon dioxide, for example, is thermally grown on a P-type silicon semiconductor wafer. Then a central portion of the silicon dioxide on the front side of the wafer is etched away so as to create an emitter opening therein, and the oxide is removed from the entire back side of the wafer. A moat is formed in the wafer around the emitter region, preferably by etching through an opening in the oxide. The moat etching may be done either before or after the emitter opening is formed in the oxide. A predeposition step is then carried out to deposit donor impurity on the surface within the emitter opening, and on the surface of the moat exposed through the corresponding opening, and also on the entire back surface of the semiconductor wafer. This forms N+ layers for the emitter and collector, and also at the surface of the moat. A diffusion baking step is then carried out to cause the N+ layers to be diffused into the semiconductor wafer. The time and temperature of the diffusion baking step are controlled so that by diffusion the N+ emitter region moves inward from the front surface of the semiconductor wafer toward the N+ collector layer, which also moves inward from the back surface of the wafer. The final spacing between these two regions is the base width of the transistor.

The transistor of the invention can also be constructed by applying an epitaxial layer on a substrate with the epitaxial layer forming the base region and the substrate forming part of the collector region. The moat is then etched in the epitaxial layer and the emitter and the connection from the moat to the collector is formed by diffusion. Although the transistor has been described having a P-type base region, it is obvious that either conductivity type can be used.

As shown in FIG. 1, a semiconductor wafer 10 is provided. This wafer is P-type silicon, and its resistivity may be of the order of 3 ohm-centimeter. Its thickness may be about 5.5 mils. A plurality of transistor elements may be fabricated simultaneously in such a wafer. However, for purposes of clarity, the representations of FIG. 1 and also FIGS. 2 and 3 shows the formation of a single transistor element in a portion of the wafer.

Figure 1B:
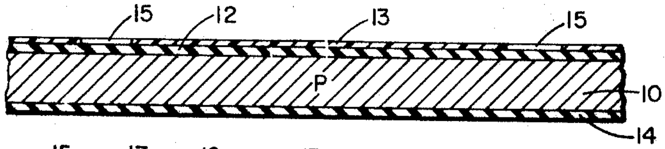

In FIG. 1B, a silicon dioxide film 12 is formed on the front surface, and a silicon dioxide film 14 is formed on the back surface. These films may be formed by placing the wafer 10 in an oxidizing atmosphere in a high temperature furnace. For example, the oxide films may be produced by subjecting the wafer 10 to two hours of steam and oxygen at a temperature of 1150° C. The silicon dioxide layer 12 is to be used as a mask for the front surface of the substrate 10, and the layer 14 is not to be used.

A layer of photo-resist 13 is placed over the silicon dioxide layer 12 (FIG. 1B), and this photo-resist is exposed to light rich in ultraviolet, and developed photographically to provide an annular opening 15 where a moat is to be formed. The wafer is then placed in a bath containing an etchant such as hydrofluoric acid which attacks the silicon dioxide exposed by opening 15 and also the silicon dioxide layer 14 on the back side of the wafer. The etchant removes the silicon dioxide in those areas where it is exposed.

Figure 1C:
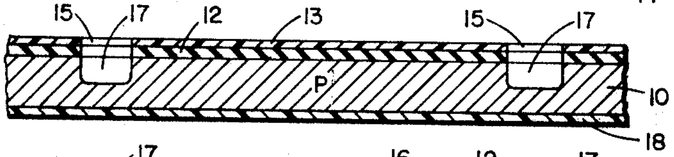

A coating 18 of etch resistant material is then applied to the back side of the wafer (FIG. 1C). This may be a coating of wax which is sprayed on the back side of the wafer as a solution of wax and trichlorethylene or, the back of the wafer can be embedded in wax which has been melted onto a glass slide. Alternatively, the coating 18 may be a photo-resist layer which is exposed and developed so that it will resist attack by an etchant.

The wafer is then placed in an aqueous solution of an etchant, such as a mixture of hydrofluoric acid, nitric acid and acetic acid. This etches the wafer itself at opening 15 to remove silicon and thereby form a moat 17 in the wafer 10 (FIG. 1C). The photo-resist layer 13 is then stripped from the front of the wafer, and the wax or photo-resist coating 18 is removed from the back of the wafer.

Figure 1D:
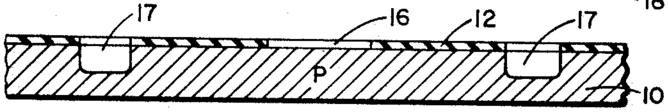

A fresh layer of photo-resist is now put on the front side of the wafer. This photo-resist layer is selectively exposed and developed to remove photo-resist from a central portion of the silicon dioxide. The exposed silicon dioxide in this central portion is etched away using hydrofluoric acid to form an emitter opening 16 as shown in FIG. 1D. The photo-resist layer is then removed.

Figure 1E:
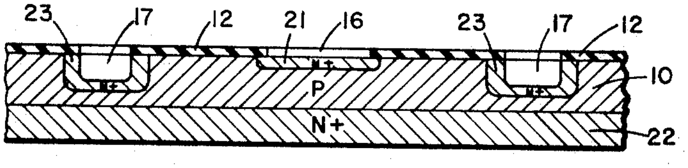

The wafer then undergoes a predeposition step, shown by FIG. 1E. During this step, the wafer is placed for one hour in a reactor at 1080° C. in an atmosphere of phosphorus oxychloride ($POCl_3$) gas transported in nitrogen. This causes three thin regions 21, 22 and 23 of highly doped negative conductivity (N+) characteristics to be formed in the wafer. Region 21 is the emitter, region 22 (on the back side) is the collector, and region 23 is the diffused moat. The $POCl_3$ is a source of phosphorus, a donor impurity, and phosphorus diffuses into the wafer to an extremely shallow depth during the predeposition step. The predeposition step is really a combination of deposition and diffusion which provides a high donor concentration in regions 21, 22 and 23. The donor impurity in these regions can then be driven in by a subsequent diffusion baking step to provide a desired impurity gradient in the diffused regions.

An annular base opening 24 may then be formed in the silicon dioxide layer 12 (FIG. 1F) in the same manner, for example, as the opening 16 was formed. The opening 24 may surround the emitter opening.

Figure 1F:
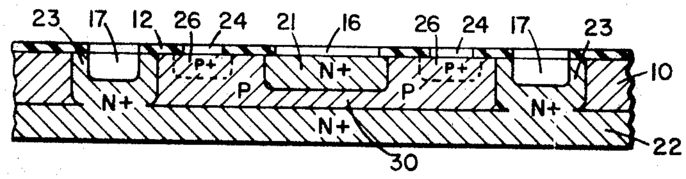

The assembly is then placed in a furnace for heat treatment, so that is may undergo the diffusion FIG. 1F. For example, the unit may be placed in a furnace for from twenty to forty hours in oxygen at 1250° C. This diffusion step causes the N+ regions 23 and 22 to merge together.

Also, if an atmosphere containing a source of acceptor impurity, for example, boron oxide ($B_2O_3$), is provided in the furnace, the impurity will diffuse into a portion 26 of the base region 30 and will lower the resistivity of this portion. The portion 26 is shown as a P+ region because it has higher conductivity than the rest of the base region. A low concentration of boron oxide is used so that the N+ regions 21, 22 and 23 will not be converted to P-type material even though some boron will diffuse into the N+ regions. The penetration of the P+ portion 26 into the base region is not critical, since its function is to enhance the formation of ohmic contact with the semiconductor material.

It will be observed in FIG. 1F that the boundary between the region 21 and the region 30 constitutes the emitter-base junction. This junction extends to the front surface of the semiconductor wafer and terminates under the oxide layer 12. The boundary between region 22 and region 30 is the collector junction, and this junction is extended up to the top surface by region 23 which also adjoins region 30.

Figure 1G:
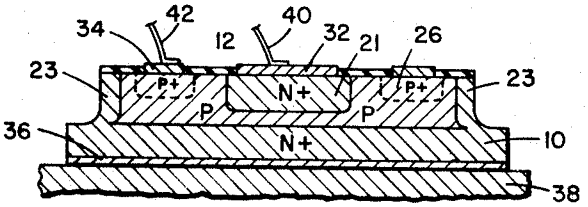

As stated above, the opening 16, FIG. 1F, in the silicon dioxide mask 12 defines the emitter area, and that area may be metallized, as shown in FIG. 1G, to form an emitter contact 32. Likewise, the base area defined by the opening 24 (FIG. 1F) may be metallized to form a base contact 34. In like manner, the back surface of the wafer may be metallized to form a collector contact 36.

The unit, as shown in FIG. 1G is mounted on an appropriate conductive member 38, which may be part of a header, in accordance with the usual practice. An appropriate lead 40 may be affixed to the emitter contact 32 by known bonding techniques. Likewise, a lead 42 may be affixed to the base contact 34 in the same manner. The device is sealed by welding a cap to a portion of member 38, which is not shown in the drawings.

As noted above, it is usual to fabricate a plurality of transistor elements in side-by-side relationship in a single water. At the end of the process, the different transistor elements may be separated from one another by breaking them at the moats 17. The wafer has been weakened at the moats, and so will tend to break there. However, to encourage this further, the wafer may be scribed along the bottom of the moats particularly if the moats are linear and intersect at an angle to each other and constitute the line of division between adjoining transistors. Note that the scribing can also be done outside the moat and the wafer will still break along the scribed lines; the breaking force will concentrate at the scribed lines. In this case, the final transistor will have the full moat 17 in the semiconductor unit.

It will also be noted in FIG. 1F, for example, that the P+ portion 26 of the base region 30 does not approach the emitter-base junction between the emitter region 21 and the base region 30. The base 30 is high resistivity material. Because of this, there is no tendency for the low resistivity P+ portion to reduce the breakdown voltage of the emitter-base junction.

FIG. 4 shows, in perspective view, a transistor element of the invention as described heretofore. In this view the emitter contact area 32′ can be seen clearly. Also clearly shown is the base connection areas 34′. Due to the small relative sizes the portion of the silicon dioxide layer 12 between the base and emitter contact areas is represented by a single line. The partial moat portion 17′ and the portion 23' of the collector (FIG. 1G) which comes to the upper surface of the wafer are indicated. Conductive member 38' corresponds to conductive member 38 of FIG. 1G to which the major area of the collector portion of the transistor element is mounted for electrical and thermal conduction. The view is shown to illustrate the appearance of a mounted transistor element in greater over-all view than is shown in the detailed cross-section of FIG. 1G.

FIG. 5 is an actual size view of a completed transistor manufactured according to the invention.

Figure 2A:
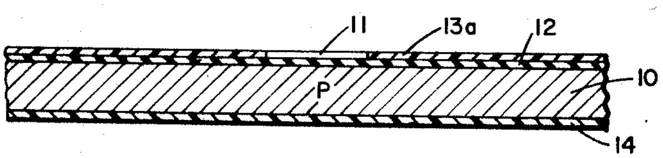
Figure 2B:
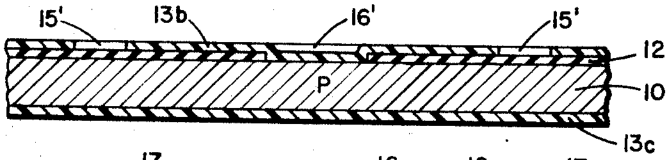
Figure 2C:
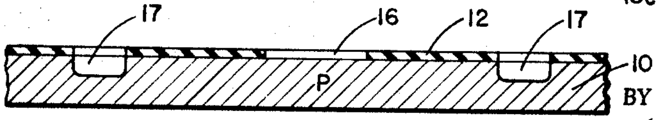

FIG. 2 is very similar to FIG. 1, and therefore will not be described in detail. The same reference numerals have been used in FIGS. 1 and 2, except where there are differences. The only substantial difference of FIG. 2 is that the emitter opening 16' (FIG. 2B) is formed before opening the hole 15' for defining the moat. In FIG. 2A, the wafer 10 is shown after the silicon dioxide layers 12 and 14, and the photo-resist coating 13*a* have been applied, exposed and developed to define an opening 11. Photo-resist is not applied to the back side of the wafer. The wafer is then etched using hydrofluoric acid to remove the oxide layer 14 and also to remove the oxide within the opening 11. The photo-resist layer 13*a* is then stripped from the wafer and fresh coatings of photo-resist are applied to both sides of the wafer. These coatings are exposed and developed to open the annular opening 15', as shown in FIG. 2B. The coating 13*b* covers and protects the silicon surface within the opening 16' for defining the emitter. The coating 13*c* covers and protects the entire back side of the wafer.

The wafer is again etched with hydrofluoric acid to extend opening 15' through the oxide. Then the wafer is etched with a mixture of hydrofluoric, nitric and acetic acids in an aqueous solution to form the moat 17 (FIG. 2C), and the coatings 13*b* and 13*c* are stripped from the wafer. The remaining steps are the same as FIG. 1.

It is also possible to form the emitter opening in the silicon dioxide layer 12 at the same time that the opening for the moat is formed. In such case an etch resisting coating must be provided on both sides while the moat is etched. A wax coating may be used on the back side as previously described.

The invention can also be applied to the manufacture of transistor elements made by other techniques, and the steps of manufacture wherein an epitaxial layer is used is shown in FIG. 3. Beginning with a wafer 50, FIG. 3A, of semiconductor material having a conductivity type desired in the collector of a transistor, for example, N-type, and which has been prepared by known methods, a layer of material 51 of opposite conductivity (for example, P-type) is grown on the wafer by epitaxial methods which are well known. The epitaxial layer will furnish the base portion of the finished transistor elements, and can be approximately twenty-five microns in thickness. The wafer is then processed in much the same manner described heretofore for FIG. 1, steps B, C, D, E and F, except that moat etching depth and diffusion depths are not so deep because the epitaxial layer 51 is relatively thin and a deep diffusion would cause the impurity material to diffuse through the epitaxial layer. The diffusion of impurity material into the side of the wafer opposite to the epitaxial layer is done to form a low resistivity region in the wafer which facilitates forming of ohmic contact to that surface.

As shown in FIG. 3A, silicon dioxide films 52 and 53 are formed on the exposed surface of the epitaxial layer and the back surface of the wafer respectively. By means of well-known photo-resist and etching methods an etch resistant mask 54 is applied over oxide layer 52. An opening 55 is etched through oxide layer 52 for the emitter of the transistor element. An annular opening 56, FIG. 3B, is etched through oxide layer 52 for subsequent etching of moat 57, FIG. 3C. When moat 57 is etched into the epitaxial layer 51, emitter opening 55 is protected from etch solution by an etch resistant mask, 54*a* (FIG. 3B). When mask 54*a* is applied to the epitaxial layer, mask 54*b* is applied over all of the back side of the wafer. The depth and width of moat 57 will vary as the particular transistor design requires. Some values which have been used are a depth of about one half the thickness of epitaxial layer 51, and a width about five times the depth.

FIG. 3C shows a predeposition 58 in the moat 57 and emitter opening 55 of impurity material of conductivity opposite that of the epitaxial layer 51, for example, N-type. Also shown is a predeposition 58*a* on the back side of the wafer of the same impurity material as in 58. Impurity 58*a* is not used to form a junction, but is applied to enhance the formation of ohmic contact to the back side of the wafer as stated above.

FIG. 3D shows the wafer after the predeposition impurity 58 and 58*a* has been diffused into the wafer to a predetermined depth by baking in a furnace. Impurity region 58 in moat 57 joins with the surface of wafer 50 which is the collector portion of the transistor element. This joining brings the collector junction to the exposed surface of epitaxial layer 51 under passivating layer 52. Thus the base-collector junction 61 is brought to the same surface as is the base-emitter junction 62 and both junctions are protected from contamination by foreign materials by passivated layer 52. Also shown is a region 59 of P+ material. This region is applied in the same manner as stated heretofore for portion 26, FIG. 1F.

FIG. 3E shows a single transistor element which has been separated from the wafer and mounted to an appropriate conductive member, in the manner described heretofore in FIG. 1G.

The structure of FIG. 3 can also be provided by diffusing a layer into a substrate and then cutting or grinding the substrate so that layer 51 is the undiffused portion of the substrate, and layer 50 is the diffused portion. The remaining steps of FIG. 3 can be carried on as described.

While particular embodiments of the process and unit have been described, it is evident that modifications may be made. One obvious modification would be to make PNP transistors by the same process. This can be accomplished by simply reversing the conductivity types of the starting material and the diffusants in the process described above. It should also be noted that the drawings of this application are not to scale, and that some simplifications have been made. For example, the oxide layers would ordinarily become thicker during the diffusion steps, but this has not been shown. Oxide would form on the surfaces within the mask openings during the diffusion steps if an oxidizing atmosphere is used.

I claim:

1. A method of making a transistor including the steps of:

(a) providing a semiconductor element having a first layer of one conductivity type and a second adjacent layer of the opposite conductivity type, (b) forming a diffusion masking layer on the exposed surface of said first layer having a first hole therein for defining an emitter region for a transistor and having a second annular hole therein surrounding said first hole for defining the area and geometry of a collector region for a transistor, (c) selectively etching the material of said first layer under said second hole in said masking layer to form a moat-like depression thereunder extending into said first layer to a predetermined depth, (d) and simultaneously diffusing an impurity of said opposite conductivity type into said first layer simultaneously through both said first and second holes of said masking layer to form in said first layer an emitter region under said first hole, and a diffused portion at said moat-like depression which extends to said second layer and which together with said second layer form a collector region, with the material between said emitter region and said collector region constituting the base region for a transistor.

2. A method of making a transistor including the steps of:

(a) providing a semiconductor element having first and second adjacent layers of opposite conductivity types, (b) forming a diffusion masking layer on the exposed surface of one of said layers having a first hole therein for defining an emitter region for a transistor and having a second annular hole therein surrounding said first hole for defining the area and geometry of a collector region for a transistor, (c) selectively etching the material of said one layer through said second hole to form a moat-like depression extending into said one layer to a predetermined depth, (d) diffusing an impurity of the conductivity type opposite to that of said one layer simultaneously through both said first and second holes of said masking layer to form in said one layer an emitter region under said first hole, and a diffused portion under said second hole which extends to the other layer and which together with said other layer form a collector region, with the material between said emitter region and said collector region constituting the base region for a transistor, and (e) making individual electrical connections to said emitter region, said base region and said collector region.

3. A method of making a transistor including the steps of:

(a) providing a semiconductor element having a first layer of one conductivity type and a second adjacent layer of the opposite conductivity type, (b) forming a diffusion masking layer on the exposed surface of said first layer having a first hole therein for defining an emitter region for a transistor and having a second annular hole therein surrounding said first hole for defining the area and geometry of a collector region for a transistor, (c) selectively etching the material of said first layer under said second hole in said masking layer to form a moat-like depression thereunder extending into said first layer to a predetermined depth, (d) diffusing an impurity of said opposite conductivity type into said first layer simultaneously through both said first and second holes of said masking layer to form in said first layer an incomplete emitter portion under said first hole, and a diffused portion at said moat-like depression which extends toward said second layer and which forms an incomplete collector portion, with the material in said first layer between said emitter portion and said collector portion constituting the base region for a transistor, (e) forming a third hole through said masking layer which is positioned between and separated from said first hole and said moat, (f) diffusing an impurity of said one conductivity type through said third opening into said base region at a temperature and for a time which causes said emitter and collector portions to penetrate further into said first layer to complete the emitter region of the transistor, with said collector portion extending to said second layer and completing therewith the collector region of the transistor, and (g) making individual electrical connections to said emitter region, said base region and said collector region.

4. A method of making a transistor including the steps of:

(a) providing a semiconductor wafer of one conductivity type having first and second major surfaces on opposite sides thereof, (b) forming a diffusion masking layer on said first surface, (c) opening a first hole through said masking layer for defining an emitter region for a transistor, (d) covering at least the surface portion of said unit within said first hole with etch-resist, (e) opening a second annular hole through said masking layer surrounding and separated from said first hote for defining the area and geometry of a collector region for a transistor, (f) selectively etching the material of said wafer within said second hole to form a moat-like depression extending into said wafer from said first surface to a predetermined depth in said wafer measured from said first surface, (g) diffusing an impurity of the conductivity type opposite said one type into said wafer simultaneously through both said first and second holes and also into said second surface of said wafer to thereby form in said wafer an emitter region under said first hole, a first portion of a collector region adjacent said second surface, and a second portion of said collector region under the surface of said moat-like depression, the material between said emitter and collector regions constituting the base region for a transistor, (h) and making individual electrical connections to said emitter region, said base region, and said collector region.

5. A method of making a transistor including the steps of:

(a) providing a semiconductor wafer of one conductivity type having first and second major surfaces, (b) forming a diffusion masking layer on said first surface of said wafer, (c) opening a first hole through said masking layer having a closed-loop configuration for ultimately defining the area and configuration of a collector region for a transistor, (d) selectively etching the material of said wafer at said opening to form a moat extending into said wafer from said first surface a predetermined distance measured from said first surface, (e) opening a second hole through said masking layer within said first hole for defining an emitter region for a transistor, (f) diffusing an impurity of the conductivity type opposite said one type into said wafer simultaneously through both said first and second holes and also into said second surface of said wafer to thereby form an emitter region under said second hole and a collector region under said second surface, the impurity diffused through said first hole forming a region which merges with said collector region and effectively extends the same through said wafer along the inner side of said moat to said first surface at a portion thereof under said masking layer, and the material between said emitter and collector regions constituting the base region for a transistor and having two PN junctions bounding the same on opposite sides with both of said junctions emerging from said wafer at said first surface under said masking layer.

(g) and making individual electrical connections to said emitter region, said base region, and said collector region.

6. A method of making a transistor including the steps of:

(a) providing a semiconductor wafer of one conductivity type having first and second major surfaces, (b) forming a diffusion masking layer on said first surface of said wafer, (c) opening a first hole through said masking layer having a closed-loop configuration for ultimately defining the area and configuration of a collector region for a transistor, (d) selectively etching the material of said wafer at said opening to form a moat extending into said wafer from said first surface to a predetermined depth measured from said first surface, (e) opening a second hole through said masking layer within but separated from said first hole for defining an emitter region for a transistor, (f) predepositing and diffusing an impurity of the conductivity type opposite said one type into said wafer through said first and second holes and also through said second surface of said wafer to thereby form in said wafer an emitter region under said first hole, a collector region under said second surface, and a moat-diffused region under the surface of said moat, the material between said emitter and collector reions constituting the base region for a transistor, (g) opening a third hole through said masking layer which surrounds said second hole in a position between said moat and said emitter region and separated from said emitter region and said moat-diffused region, (h) diffusing an impurity of said one conductivity type into said wafer through said third opening to increase the concentration of that type of impurity in a portion of said base region under said third opening, the latter diffusion being accomplished at a temperature and for a time which causes said emitter and collector regions to penetrate further into said wafer toward each other until a desired base width is obtained, and which temperature and time also causes said moat-diffused region and said collector region to diffuse together under said moat so that said moat-diffused region effectively extends said collector region to said first surface under said masking layer, (i) and making individual electrical connections to said emitter region, said collector region, and said diffused portion of said base region, said masking layer being electrically insulating and being left permanently on said first surface.

7. A method of making a transistor including the steps of:

(a) providing a semiconductor wafer of one conductivity type having a substantially flat major surface, (b) epitaxially growing a layer of semiconductor material of opposite conductivity type to said one conductivity type on said major surface of said wafer, with said epitaxially grown layer having an exposed surface opposite to said major surface, (c) forming a diffusion masking layer on said exposed surface of said epitaxially grown layer having a first hole therein for defining an emitter region for a transistor and having a second annular hole therein surrounding said first hole for defining the area and geometry of a collector region for a transistor, (d) selectively etching the material of said epitaxially grown layer within said second hole to form a moat-like depression extending into said epitaxially grown layer to a predetermined depth, and (e) diffusing an impurity of said one conductivity type into said epitaxially grown layer simultaneously through both said first and second holes of said masking layer to form in said epitaxially grown layer an emitter region under said first hole, and a diffused portion under said second hole which extends to said wafer and forms therewith a collector region, with the material between said emitter region and said collector region constituting the base region for a transistor.

8. A method of making a transistor including the steps of:

(a) providing a semiconductor wafer of one conductivity type having a major surface which has been prepared to receive an epitaxially grown layer of semiconductor material, (b) epitaxially growing a layer of semiconductor material of opposite conductivity type to said one conductivity type on said major surface of said wafer, with said epitaxially grown layer having an exposed surface opposite to said major surface, (c) forming a diffusion masking layer on said exposed surface of said epitaxially grown layer having a first hole therein for defining an emitter region for a transistor and having a second annular hole therein surrounding said first hole for defining the area and geometry of a collector region for a transistor, (d) selectively etching the material of said epitaxially grown layer within said second hole to form a moat-like depression extending into said epitaxially grown layer to a predetermined depth, (e) diffusing an impurity of said one conductivity type into said epitaxially grown layer simultaneously through both said first and second holes of said masking layer to form in said epitaxially grown layer an emitter portion under said first hole, and a diffused portion under said second hole which extends toward said wafer and forms a collector portion, with the material between said emitter portion and said collector portion constituting the base region for a transducer, (f) forming a third hole through said masking layer which is positioned between and separated from said first hole and said moat, (g) diffusing an impurity of said one conductivity type through said third opening into said base region by the use of a temperature and time which causes said emitter and collector portions to penetrate further into said first layer to form the emitter region of the transistor, with said collector portion extending to said wafer and forming therewith the collector region of the transistor, and (h) making individual electrical connections to said emitter region, the diffused portion of said base region, and said collector region.

References Cited

UNITED STATES PATENTS

| | | | |
|---|---|---|---|
| 2,910,634 | 10/1959 | Rutz | 148—33.5 XR |
| 2,989,713 | 6/1961 | Warner | 148—187 XR |
| 3,041,213 | 6/1962 | Anderson | 148—187 XR |
| 3,226,611 | 11/1965 | Haenichen. | |
| 3,255,056 | 6/1966 | Flatley | 148—187 |
| 3,289,267 | 12/1966 | Ullrich | 148—186 |
| 3,332,143 | 7/1967 | Gentry | 148—1.5 XR |

HYLAND BIZOT, *Primary Examiner.*